United States Patent [19]

McGinn

[11] Patent Number: 4,853,641
[45] Date of Patent: Aug. 1, 1989

[54] DIFFERENTIAL PHASE REDUCTION CIRCUIT FOR A VIDEO DEMODULATING SYSTEM AND METHOD

[75] Inventor: Michael McGinn, Scottsdale, Ariz.

[73] Assignee: Motorola, Inc., Schaumburg, Ill.

[21] Appl. No.: 161,555

[22] Filed: Feb. 29, 1988

[51] Int. Cl.⁴ ............................................. H03D 3/18
[52] U.S. Cl. .................................... 329/50; 329/122; 329/134; 329/136; 358/195.1
[58] Field of Search ................. 329/50, 110, 122, 134, 329/135, 136, 163; 358/23, 24, 25, 35, 36, 167, 195.1, 198

[56] References Cited

U.S. PATENT DOCUMENTS 4,731,872  3/1988  Washburn, Jr. ................ 329/134 X

*Primary Examiner*—Eugene R. LaRoche
*Assistant Examiner*—David Mis
*Attorney, Agent, or Firm*—Michael D. Bingham

[57] ABSTRACT

In a stereo television video demodulating system comprising an IF filter coupled via a limiter stage to a phase detector of a phase locked loop and further coupled to a video demodulator, a phase reduction circuit for reducing differential phase effects in the television which includes a capacitive circuit coupled between an output of the video demodulator and the multiplier section of the phase detector and a resistive circuit coupled between an output of the video demodulator and the multiplier section.

6 Claims, 2 Drawing Sheets

DIFFERENTIAL PHASE REDUCTION CIRCUIT FOR A VIDEO DEMODULATING SYSTEM AND METHOD

BACKGROUND OF THE INVENTION

The present invention relates to television demodulating system and, more particularly, to a circuit and method for reducing differential phase errors associated with receivers designed for reception of stereo sound.

Most contemporary television receivers utilize some means of regenerating the video IF carrier so that the IF signal can be demodulated. Any change in the phase of this regenerated IF carrier with signal amplitude will result in a loss of performance in both the video and sound channels. The phase locked loop (PLL) and pseudo synchronous demodulating systems are the two most commonly used methods of regenerating the video carrier. Both methods incorporate a limiter and an IF bandpass filter. The latter precedes the IF amplifier and demodulators and provides most of the selectivity of the TV receiver. Unfortunately, due to the nature of the TV signal having unequal side bands (vestigial transmission) and the action of the IF filter, quadrature differential phase errors are inherent to the system and cause problems with the above demodulating system. In a PLL demodulator this produces a signal at the output of the phase detector proportional to the video which will in turn phase modulate the VCO of the PLL. The end result of this will be changes in color with video amplitude, notably high frequency video beat notes between the sound and video signals and audible video on sound. With the advent of stereo TV sound, the latter interference of the FM sound intercarrier by the video signal has become very important. An acceptable fifty to sixty decibels of sound to interference for a mono-sound transmission being degraded to an unacceptable twenty to thirty decibels for stereo transmission.

Similarly, differential phase changes may occur due to changes in phase with signal amplitude through the limiter stage of the demodulating system. This change in phase also gives rise to a change in the output current of the phase detector. However, the change is in-phase as opposed to the quadrature change produced by the IF filter as described above.

Both of the above described components of the differential phase are highly undesirable. Some prior art stereo televisions using PLL type demodulating systems attempt to minimize differential phase effects by using a separate sound IF demodulating system that duplicates the video demodulating system. This approach requires a separate sound IF filter and adds to the cost of manufacture of the television receiver. Moreover, this approach does not eliminate the in-phase component of the differential phase effect due to the limiter stage that is still present in the separate sound IF section.

Hence, a need exists to reduce differential phase effects in televisions and, in particular, those designed for stereo sound reception.

SUMMARY OF THE INVENTION

Accordingly, it is an object of the present invention to provide a circuit and method for reducing differential phase effects in a PLL type demodulating system.

In accordance with the above and other objects there is provided a phase reduction circuit for use in a PLL type video demodulating system of a television receiver which includes a first resistive circuit coupled between an output of the video demodulator of the demodulating system and the phase detector of the PLL for providing a current proportional to the video demodulated output signal to reduce in-phase components of differential phase effects; and a second capacitive circuit coupled between an output of the video demodulator and the phase detector for reducing quadrature components of the differential phase effects.

DETAILED DESCRIPTION OF THE PREFERRED EMBODIMENT

Figure 1:
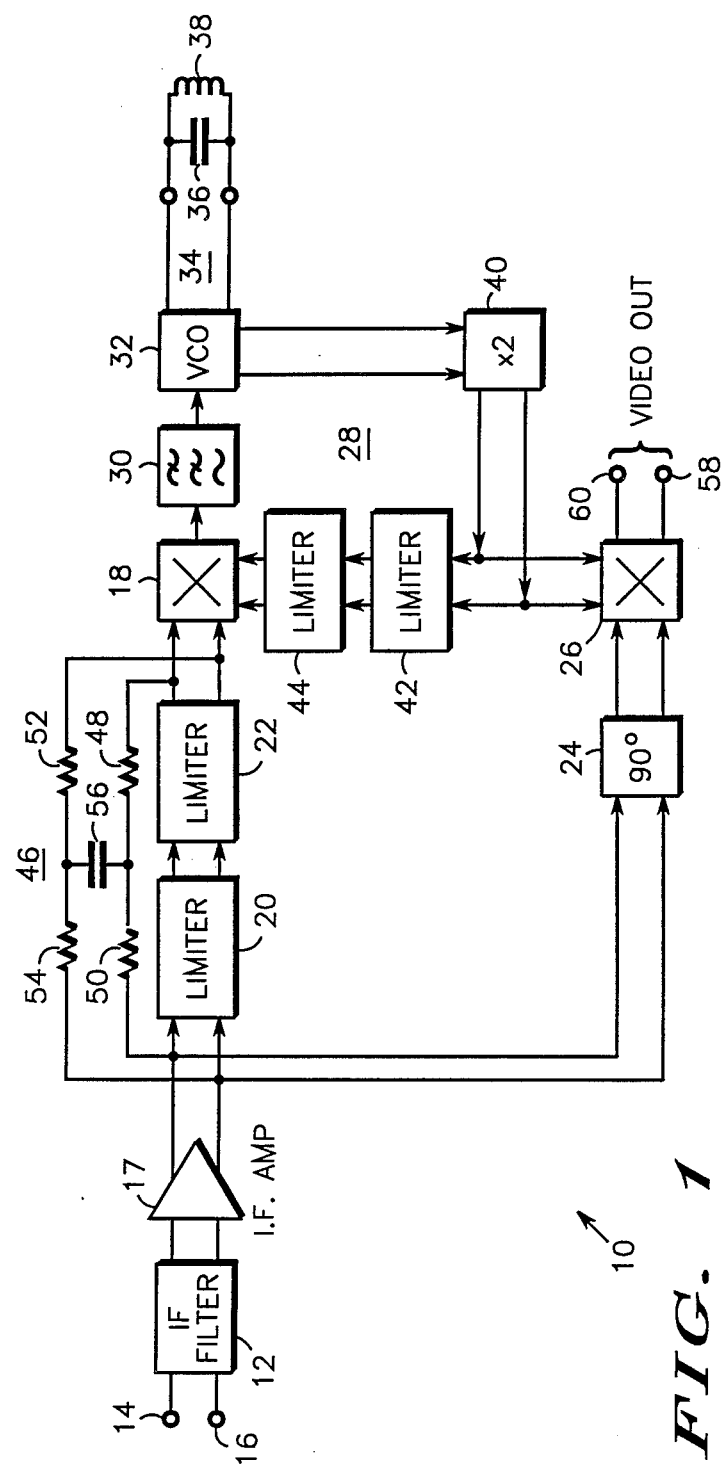
FIG. 1 is a partial block and schematic diagram illustrating a video demodulating section of a television receiver.

Turning now to FIG. 1 there is shown a video demodulating section of a stereo television. The operation of video demodulating system 10 is described in pending U.S. application, Ser. No. 080,934, filed on Aug. 3, 1987 and entitled "VIDEO DEMODULATOR SYSTEM", the teachings of which are incorporated herein by reference made hereto. Briefly, video demodulating system 10 includes intermediate frequency (IF) filter 12 which receives a television composite signal at inputs 14 and 16. The IF television signal in which the video carrier information is embedded is amplified by amplifier 17 and supplied to the balanced inputs of phase detector 18 via series connected limiter stages 20 and 22. The limiter stages tend to strip the amplitude modulation from the signal as is understood. The output of amplifier 17 is also applied to balanced demodulator 26 via ninety degree phase shifting circuit 24. Phase detector 18 comprises part of the nested phase locked loop 28 which further includes low pass filter 30 coupled between phase detector 18 and voltage controlled oscillator 32, the latter of which is tuned to one-half the frequency of the video carrier by tuned circuit 34. Tuned circuit 34 comprises capacitor 36 and inductor 38. The output of VCO 32 is applied to X2 multiplier 40 which doubles the oscillator frequency. The output of X2 multiplier 40 is applied to a second pair of series connected limiter stages 42 and 44 wherein the outputs of the latter stage is applied to additional inputs of phase detector 18. The outputs of X2 multiplier 40 are also applied to inputs of demodulator 26 in phase with the video carrier signal supplied from phase shifter 24.

Feedback circuit 46 comprising resistors 48, 50, 52, and 54 as well as capacitor 56 is coupled between the of limiter stage 22 and the inputs of limiter stage 20. Feedback circuit 46 eliminates phase errors associated with DC offsets in the two limiter stages.

In operation, as long as the IF signal is within the lock up range of PLL 28, the video carrier signal will be detected and demodulated to provide out of phase video demodulated information signals at outputs 58 and 60 of balanced demodulator 26.

In order to reduce circuit complexity and to combine the sound demodulation system with the video demodulation system onto a single integrated circuit it is desirable to incorporate a quadrature demodulator for demodulating the sound information signal that is present in the composite television signal supplied at inputs 14 and 16. In this case the outputs of amplifier 17 and X2 multiplier 40 are supplied to a demodulator (not shown) substantially identical to demodulator 26. A system of this type is described in U.S. patent application, Ser. No. 081,041, filed on Aug. 3, 1987 and entitled "AUTOMATIC FREQUENCY CONTROL SYSTEM" the teachings of which are also incorporated by reference made hereto.

As previously mentioned, a differential phase error is created by the bandpass characteristics of filter 12. The differential phase error associated with filter 12 is impinged on the carrier signal that is supplied at the output thereof such that when demodulated video information is placed on the sound information signal. Besides having a frequency modulation component supplied thereto because of filter 12, phase detector 18 will be effected by differential phase errors due to changes in phase with signal amplitude in the limiter stages 20 and 22.

Figure 2:
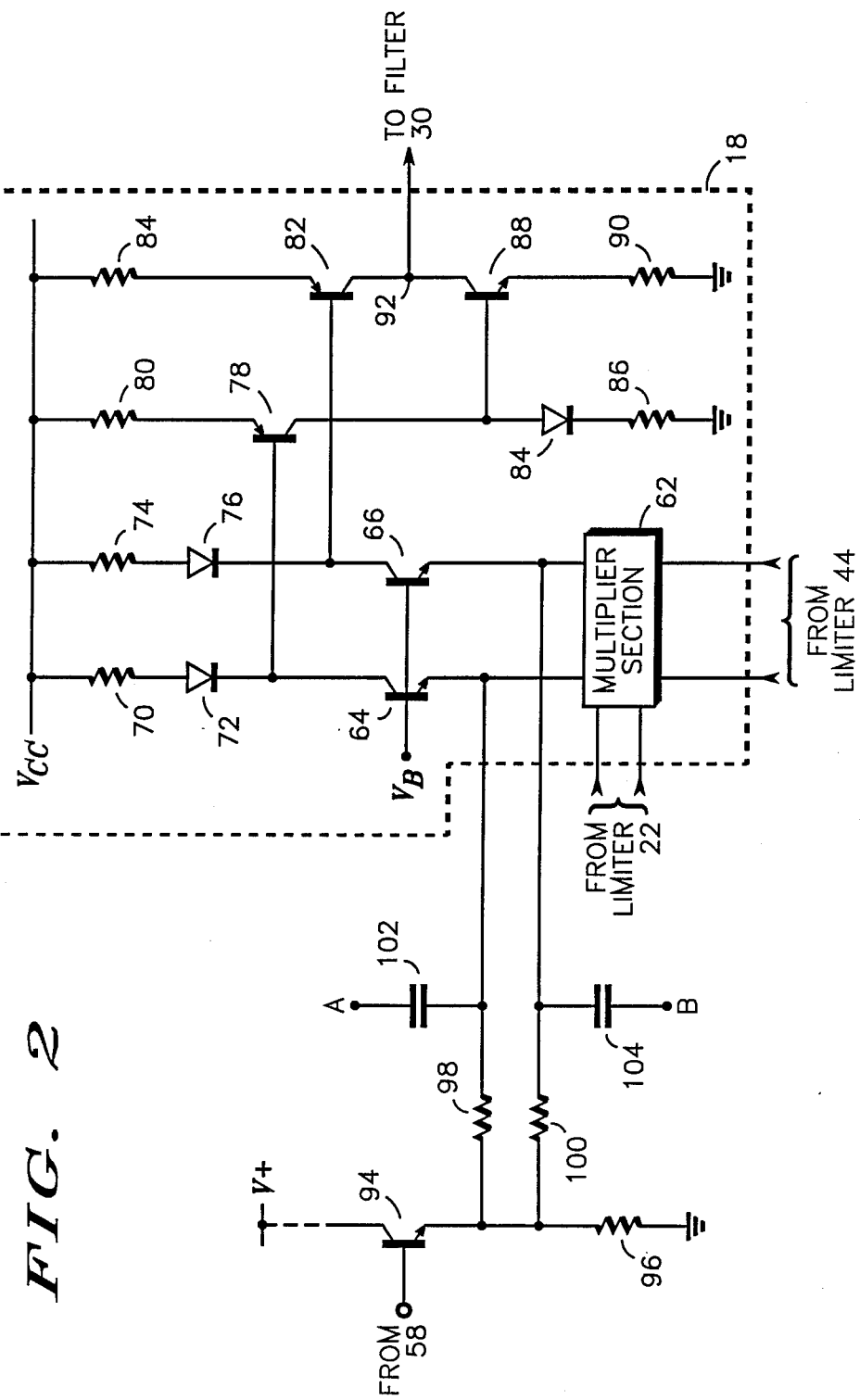
FIG. 2 is a partial block and schematic diagram illustrating the differential phase reduction circuit of the present invention.

In order to eliminate or reduce the differential phase effects discussed above a differential phase reduction circuit is now described in reference to FIG. 2.

Since a change in phase gives rise to a change in the output current of phase detector 18 due to the normal action of PLL 28 the phase reduction circuit of the preferred embodiment will be now described that will provide a current to cancel the output current of the phase detector related to the differential phase effects.

As illustrated in FIG. 2, the balanced outputs of multiplier section 62 of phase detector 18 are coupled through a pair of transistors 64 and 66 to a current turn around circuit which provides a single ended output to filter 30. It is the object of the differential phase reduction circuit to feedback a component of the demodulated video signal of correct phase to phase detector 18 to cancel any component of the differential phase that would otherwise appear in the output current of the phase detector.

Any differential phase related current appearing at the emitter of transistor 64 flows through series connected resistor 70 and diode 72 to produce current flow through transistor 78 which has its bas connected at the interconnection of the cathode of diode 72 and the collector of transistor 64. Similarly, any differential phase related current appearing at the emitter of transistor 66 flows through resistor 74 and diode 76 which are series connected from voltage supply to the collector of the transistor. This will cause current to flow through transistor 82 which has its base coupled to the collector of transistor 66. The current through transistor 78 flows through resistor 80, coupled between voltage supply and the emitter of transistor 78, to series connected diode 84 and resistor 86 which biases transistor 88 into a conducting state as its base is coupled to the collector of transistor 78. Thus a current is sourced from node 92, the output of the phase detector as transistor 88 is turned on and will produce an error voltage across filter 30. Likewise, any related differential phase current that flows through transistor 82 and resistor 84 will be sourced to node 92 to create an error voltage from filter 30. However, if the differential phase current components appearing at the outputs of multiplier section are either cancelled or are equal then there will be no net current flowing at the output of phase detector 18 as the current through transistors 82 and 88 will be equal and therefore prevent any error voltage from being supplied to the input of VCO 32.

As shown, the output of video demodulator is supplied through an emitter follower transistor 94 having its base coupled to the output 58 and its emitter connected in series to one end of resistor 96, the other end of which is returned to ground. A first resistive circuit comprising resistors 98 and 100 is provided to cancel out the in-phase component currents of the differential phase error effects due to limiter stages 20 and 22. One end of each resistor 98 and 100 is coupled to the emitter of transistor 94 while the other ends thereof are coupled respectively to the outputs of multiplier section 62. Thus, any differential phase current components arising from the video related signal appearing at the output of multiplier section 62 are cancelled by feeding back a portion of the demodulated video signal of opposite phase via resistors 98 and 100.

Similarly, any quadrature components of the differential phase error that arises due to the filter asymmetrical bandpass characteristics may be cancelled by feeding a portion of the video demodulated signal through capacitors 102 and 104 to the outputs of multiplier section 62. In general capacitors 102 and 104 may be coupled in parallel across respective resistors 98 and 100. However, if it is necessary to provide the opposite phase of the cancellation component of the demodulated video signal to the outputs of multiplier section 62, the ends of capacitors 102 and 104 can be connected to output 60 of demodulator through a second emitter follower transistor identical to transistor 94. In this case the base of the additional emitter transistor would be coupled to output 60 and the ends of capacitors 102 and 104 would then be connected at A and B to the emitter of this additional emitter follower transistor.

Hence, what has been described above is a circuit comprising both a capacitive and resistive circuit coupled between the output of the video demodulator circuit of a video demodulator system of a television and the phase detector of the PLL section of the demodulator system for cancelling or reducing differential phase effects in the system.

I claim:

1. In a video demodulating system of a television including an intermediate frequency (IF) filter, a phase locked loop comprising a phase detector and a voltage controlled oscillator (VCO) coupled to the output of the phase detector, a limiter stage coupled between the filter and the phase detector and a video demodulator coupled between the output of the filter and the VCO and having an output, the improvement comprising a circuit for reducing differential phase errors including:

first circuit means resistively coupling the video demodulator output to the phase detector for providing a current proportional to the demodulated video signal appearing at the output of the video demodulator to the phase detector to reduce the differential phase error established through the limiter stage; and second circuit means capacitively coupling the output of the video demodulator to the phase detector for providing a related current of correct polarity to the phase detector to reduce the differential phase error established by the IF filter.

2. The video demodulating system of claim 1 wherein:

the phase detector includes a multiplier section having a pair of outputs and output circuit means for coupling said pair of outputs to a single output of the phase detector; and said first circuit means includes a first resistor coupled between the output of the video demodulator and a first one of said pair of outputs of said multiplier section and a second resistor coupled between the output of the video demodulator and a second one of said pair of outputs of said multiplier section.

3. The video demodulating system of claim 2 wherein said second circuit means includes:
   a first capacitor coupled in parallel to said first resistor; and
   a second capacitor coupled in parallel to said second resistor.

4. In a video demodulating system of a television including an intermediate frequency (IF) filter, a phase locked loop comprising a phase detector and a voltage controlled oscillator (VCO) coupled to the output of the phase detector, a limiter stage coupled between the filter and the phase detector and a video demodulator coupled between the output of the filter and the VCO and having first and second outputs at which are produced out of phase demodulated video signals respectively, the improvement comprising a circuit for reducing differential phase errors including:
   first circuit means resistively coupling the video demodulator output to the phase detector for providing a current proportional to the demodulated video signal appearing at the first output of the video demodulator to the phase detector to reduce the differential phase error established through the limiter stage; and
   second circuit means capacitively coupling the second output of the video demodulator to the phase detector for providing a related current of correct polarity to the phase detector to reduce the differential phase error established by the IF filter.

5. The video demodulating system of claim 4 wherein:
   the phase detector includes a multiplier section having a pair of outputs and output circuit means for coupling said pair of outputs to a single output of the phase detector; and
   said first circuit means includes a first resistor coupled between the first output of the video demodulator and a first one of said pair of outputs of said multiplier section and a second resistor coupled between the first output of the video demodulator and a second one of said pair of outputs of said multiplier section.

6. The video demodulating system of claim 5 wherein said second circuit means includes
   a first capacitor coupled between said first one of said pair of outputs of said multiplier section and the second output of the video demodulator; and
   a second capacitor coupled between said second one of said pair of outputs of said multiplier section and the second output of the video demodulator.

* * * * *